(12) United States Patent
Rueger et al.

(10) Patent No.: US 7,569,484 B2
(45) Date of Patent: Aug. 4, 2009

(54) PLASMA AND ELECTRON BEAM ETCHING DEVICE AND METHOD

(75) Inventors: Neal R. Rueger, Boise, ID (US); Mark J. Williamson, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 11/503,762

(22) Filed: Aug. 14, 2006

(65) Prior Publication Data

US 2008/0038933 A1 Feb. 14, 2008

(51) Int. Cl.
*H01L 21/4763* (2006.01)

(52) U.S. Cl. .................. 438/695; 438/660; 438/689; 438/693; 438/905; 438/909; 257/E21.025; 257/E21.252; 257/E21.311; 257/E21.407

(58) Field of Classification Search .................. 438/695, 438/577, 579, 660, 689, 693, 712, 725, 738, 438/905, 909; 257/E21.025, 252, 311, 407
See application file for complete search history.

(56) References Cited

U.S. PATENT DOCUMENTS

| 4,832,781 | A | * | 5/1989 | Mears | 156/345.39 |
|---|---|---|---|---|---|
| 5,155,053 | A | * | 10/1992 | Atkinson | 438/577 |
| 5,508,368 | A | * | 4/1996 | Knapp et al. | 427/534 |
| 5,622,567 | A | * | 4/1997 | Kojima et al. | 118/726 |
| 5,976,328 | A | * | 11/1999 | Azuma et al. | 204/192.34 |
| 6,214,183 | B1 | * | 4/2001 | Maishev et al. | 204/298.04 |
| 6,309,972 | B1 | * | 10/2001 | Pio | 438/689 |
| 6,811,615 | B2 | * | 11/2004 | Sun | 134/1 |
| 2006/0154477 | A1 | * | 7/2006 | Geng et al. | 438/637 |
| 2006/0183055 | A1 | * | 8/2006 | O'Neill et al. | 430/316 |
| 2006/0201911 | A1 | * | 9/2006 | Edelberg et al. | 216/67 |
| 2007/0228002 | A1 | * | 10/2007 | Geng et al. | 216/37 |

* cited by examiner

Primary Examiner—Michael S Lebentritt
(74) Attorney, Agent, or Firm—Schwegman, Lundberg & Woessner, P.A.

(57) ABSTRACT

Methods and devices for selective etching in a semiconductor process are shown. Chemical species generated in a reaction chamber provide both a selective etching function and concurrently form a protective coating on other regions. An electron beam provides activation to selective chemical species. In one example, reactive species are generated from a plasma source to provide an increased reactive species density. Addition of other gasses to the system can provide functions such as controlling a chemistry in a protective layer during a processing operation.

35 Claims, 4 Drawing Sheets

US 7,569,484 B2

PLASMA AND ELECTRON BEAM ETCHING DEVICE AND METHOD

TECHNICAL FIELD

This application relates generally to semiconductor devices and device fabrication and, more particularly, to surface processing using plasma and electron beams.

BACKGROUND

Semiconductor processing is used to form structures and devices such as transistors, capacitors, etc. that in turn are used to form semiconductor memory chips, processing chips, and other integrated circuits. Semiconductor device uses range from personal computers, to MP3 music players, to mobile telephones. In the fabrication process of semiconductor structures and devices, techniques that are frequently used include material deposition processes, and material removal processes such as etching. By sequentially depositing and etching in selected regions on a semiconductor wafer, devices such as transistors, etc. are eventually formed.

As in any manufacturing process, reducing the time needed for a given manufacturing step or eliminating selected manufacturing steps reduces the cost of the final product. Selectively etching a semiconductor surface is a necessary step in most semiconductor processing operations. Selectivity can be obtained using a number of techniques, including use of a protective mask or using chemicals that selectively react with one material over another. Although techniques exist that provide some degree of selectivity, further improvements to processes that reduce time needed to complete a step, and/or eliminate processing steps are desired to further reduce cost. Improving selectivity also provides increased precision, allowing more detailed and/or smaller structure formation.

What is needed is an improved semiconductor processing method that addresses these and other concerns. What is also needed is a system to provide these methods and other processing needs. Also needed are inexpensive and high precision components formed by improved processing methods.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and chemical, structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is understood to include semiconductor on insulator wafers such as silicon-on-insulator (SOI). The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors.

Figure 1:
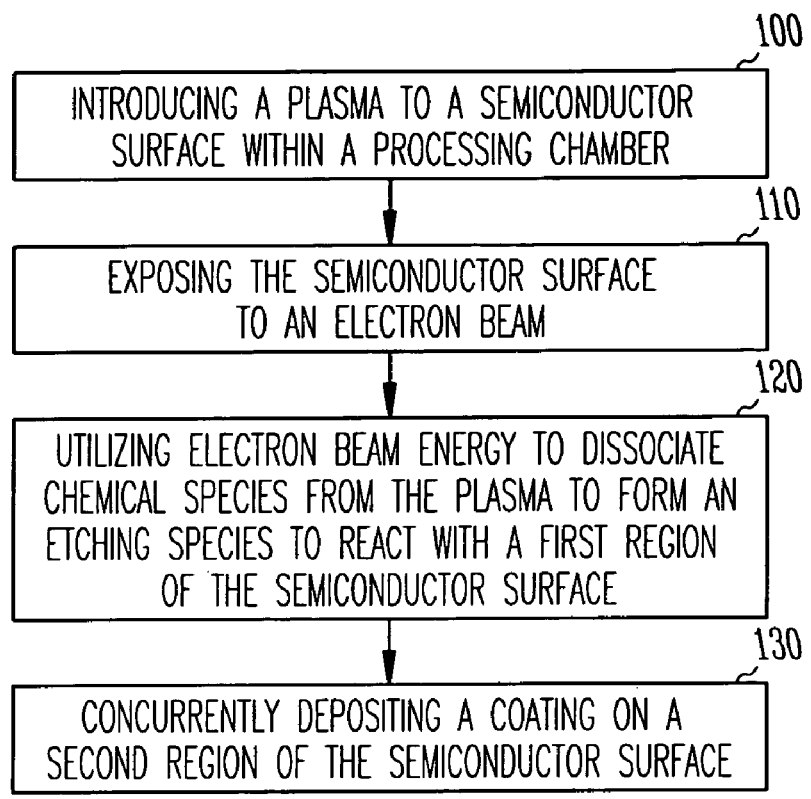
FIG. 1 shows a method flow diagram of semiconductor processing according to an embodiment of the invention.

FIG. 1 shows a flow diagram with a method of semiconductor surface processing according to one embodiment of the invention. In step 100, a semiconductor surface is included within a processing chamber, and a plasma is introduced. In one embodiment, the semiconductor surface includes one or more semiconductor wafers. One processing chamber includes an in-line production chamber where wafers are passed from station to station in a vacuum. In one embodiment, a processing chamber includes a chamber of a scanning electron microscope (SEM) as will be discussed in more detail below.

In one embodiment, the plasma is included in the chamber along with a gas source. In one embodiment only a plasma source such as a remote plasma generator is used. One of ordinary skill in the art having the benefit of the present disclosure will recognize that a portion of a plasma generated from a remote plasma source may recombine in the reaction chamber. In such an example, plasma species will be present in the reaction chamber along with non-plasma gas species. In one embodiment, the selected plasma is capable of etching a region of the semiconductor surface. In addition, in one embodiment, the plasma and/or other gas species included in the reaction chamber are capable of dissociating into one or more species that are capable of etching a region of the semiconductor surface. For example, plasma species or gas species are chosen in one embodiment to dissociate when exposed to energies supplied by an electron beam, including, but not limited to a beam in a SEM. In one embodiment, the plasma and/or gas species includes a halogen species. Examples of halogens include fluorine, chlorine, bromine, iodine, and astatine. In one embodiment, the plasma and/or gas species further includes carbon. One example of a species that includes carbon and fluorine as a halogen include $CF_4$. In one embodiment, the plasma and/or gas species includes other species such as hydrogen or another element. One example of a gas including hydrogen is $CHF_3$. In one embodiment, other species in addition to carbon and a halogen include multi-component species such as a carbon and hydrogen chain, or other combination of elements.

In step 110, the plasma and/or gas species are exposed to an electron beam. As discussed above, in one embodiment, the electron beam is generated by an electron beam source in an electron microscope such as a SEM. In a SEM embodiment, the electron beam can be focused using electromagnetic lenses. In one embodiment, the SEM configuration also provides a system to scan the electron beam over an area of the substrate. In one embodiment, such as a SEM embodiment, an imaging system is further included. In one embodiment, an imaging system includes devices such as a secondary electron detector.

One advantage of a SEM configuration includes the ability to focus and scan on only a selected portion of the substrate such as a semiconductor wafer. Another advantage of a SEM configuration includes the ability to concurrently image the selected portion of the surface being exposed to the electron beam. The ability to image allows a user to easily select the region to be exposed to the electron beam from the bulk of the semiconductor surface.

In one embodiment a material composition detection system is further included. Examples of material composition detection systems include, but are not limited to x-ray detection systems, Fourier transform infrared (FTIR) detection systems, mass spectrometers, etc. In one embodiment, a material composition detection system is used to quantify composition of a coating that is grown in conjunction with electron beam interaction. Growth of such coatings will be discussed in more detail below.

Although an electron microscope is used as an example of an electron beam source, the invention is not so limited. Other embodiments include an electron beam source without additional microscope elements such as lenses, rastering systems, secondary electron detectors, etc.

In step 120, the plasma and/or gas species is at least partially dissociated into a number of reactive species. In one embodiment, the energy from the electron beam provides at least a portion of the energy necessary to dissociate the species into the number of reactive species. The exact composition of the species will depend on the gas that is used. For example $CF_4$ gas will dissociate into a number of species such as $CF_3$, $CF_2$, and CF. One of ordinary skill in the art, having the benefit of the present disclosure will recognize that the energy of the electron beam can be adjusted to more effectively dissociate the species depending on the specific chemistry chosen. In selected embodiments, other energetic beams such as neutron beams, x-rays, etc. are used to provide energy appropriate to dissociate the chosen gas. Energetic beams such as electron beams provide an advantage in selected embodiments because they cause minimal damage to the workpiece in contrast to ion beams or other particle beams that may cause sputtering or other surface damage.

In one embodiment, the plasma and/or gas species is chosen such that the reactive species selectively etch a specific material on the semiconductor surface. In one embodiment, the reactive species are chosen to etch silicon dioxide. In one embodiment, the reactive species generated from the plasma source and/or the electron beam interaction does not etch a second material such as silicon. In one embodiment, a selective reaction such as etching is determined by a large difference in reaction rate. Although a reaction may be described as occurring on one material and not on another, in one embodiment the reaction may occur on both materials, however a substantial difference in reaction rate is observed.

In step 130, a coating is deposited on a region of the semiconductor surface, while concurrently an etching reaction is occurring on another region of the semiconductor surface. One example includes a silicon dioxide region that is adjacent to a silicon region. In one embodiment, a coating is deposited on the silicon region while the silicon dioxide region is etched at substantially the same time. Further, in one embodiment, a coating is deposited on the silicon dioxide region while the silicon region is etched at substantially the same time. Although silicon and silicon dioxide are used as examples, the invention is not so limited. Other semiconductor processing materials can be selectively etched or coated using appropriate reactive species chemistry that will be appreciated by one of ordinary skill in the art, having the benefit of the present disclosure. Examples of other semiconductor materials include, but are not limited to nitride materials, spin on glass materials, or other semiconductors such as germanium, or gallium arsenide, etc.

In one embodiment, the coating deposited at step 130 includes a carbon containing coating. In one embodiment, the coating includes an amount of halogen. Using such an example, the coating can be characterized using a ratio of halogen to carbon.

Figure 2:
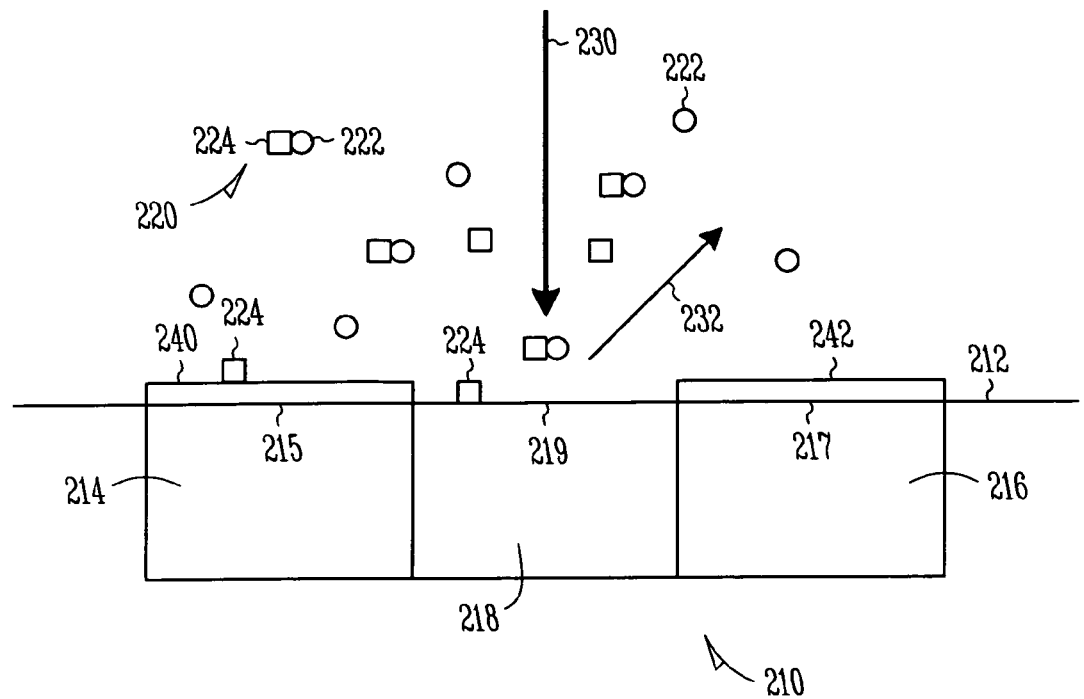
FIG. 2 shows a side view surface diagram of semiconductor processing according to an embodiment of the invention.

FIG. 2 illustrates one example of a method using some of the examples listed above. A chemical species 220 is shown in a reaction chamber over a substrate 210. The chemical species 220 can be generated by a plasma source such as a remote plasma generator. In one embodiment, the chemical species 220 includes a gas. Although for illustration purposes one form of chemical species 220 is shown in FIG. 2, the invention is not so limited. In one embodiment, the reaction chamber includes two or more different species. In one example, the reaction chamber includes species generated by a plasma source and gas species from a different gas source. In one embodiment, one or more of the chemical species 220 are capable of reacting with the substrate and/or an electron beam energy source.

In one embodiment, the chemical species 220 includes $CHF_3$. In one embodiment, the substrate 210 includes a semiconductor wafer. A first silicon region 214 and a second silicon region 216 are shown with a silicon dioxide region 218 located adjacent to the silicon regions 214, 216.

An electron beam 230 is shown directed at the substrate 210. As discussed above, in one embodiment the electron beam 230 is used to image a portion of the substrate 210, for example in a SEM device. Additional particles 232 are also shown that are generated as a result of the electron beam 230 interaction with the surface of the substrate 210. Additional particles 232 include, but are not limited to secondary electrons and backscattered particles. In one embodiment, additional particles 232 are used for imaging and/or material characterization.

In one embodiment, the electron beam is scanned over a surface 212 of the substrate 210 and interacts with the portions of the surface 212 such as silicon regions 214, 216 and silicon dioxide regions 218 during a scan. Although the electron beam 230 is indicated in FIG. 2 as a line, the diameter of the electron beam 230 can vary. In selected embodiments, the electron beam diameter is small and a surface is scanned. In other selected embodiments, the electron beam diameter is large, and a larger surface area of the substrate 210 is covered without scanning. Although it is useful in selected embodiments to have the electron beam contact large regions of the substrate 210, the invention is not so limited.

FIG. 2 illustrates the chemical species 220 as including a first subspecies 222 and a second subspecies 224. The illustration of two subspecies is used as an example only. In various embodiments, the chemical species 220 can be broken down into more than two subspecies. In one embodiment, the chemical species 220 reacts with the electron beam 230 and is dissociated into the first subspecies 222 and the second subspecies 224.

FIG. 2 shows the second subspecies 224 etching a surface 219 of the silicon dioxide region 218. Also shown are a first coating 240 on a top surface 215 of the first silicon region 214, and a second coating 242 on a top surface 217 of the second silicon region 216. In a separate reaction, one of the subspecies also forms the coatings. For example, the second subspecies 224 is shown in FIG. 2 forming the first and second coatings 240, 242.

Using $CHF_3$ gas as a gas species 220 example, a first subspecies example includes HF and a second subspecies includes $CF_2$. In the example, the $CF_2$ subspecies reacts with $SiO_2$ to form $SiOF_x$ and $CO_x$ byproducts and the $SiO_2$ surface, such as surface 219 in FIG. 2, is etched in the reaction. Further, in the example, the $CF_2$ subspecies deposits a coating on Si surfaces such as surfaces 215 and 217 of FIG. 2. In one embodiment, the coating is deposited in a polymerization reaction. An advantage of using a carbon and halogen containing gas includes the ability to both etch and deposit a coating concurrently. Specifically with $SiO_2$ and Si surfaces present, the carbon is needed in the chemical reaction to etch $SiO_2$ and the carbon further provides material to form the coating.

An advantage of forming a coating concurrent to etching includes the ability to further enhance selectivity in an etching operation. In one embodiment, the coating serves as a sacrificial coating, and further protects the coated surface from etching. As discussed above, in one embodiment, selective etching is defined as a large difference in etch rate, with a material such as silicon etching, but at a much slower rate than another adjacent material such as silicon dioxide. The presence of a coating further reduces or eliminates any etching of the non selected material. Enhanced selectivity provides a number of advantages including the ability to form more detailed structures with sharper edge profiles, etc.

As mentioned above, in one embodiment, the coating contains both carbon and an amount of halogen such as fluorine. In one embodiment, a ratio of halogen to carbon is controlled to tailor the chemical and physical properties of the coating. Controlling the coating chemistry further enhances desired properties such as selective etching. For example, materials with a lower ratio of halogen to carbon provide better resistance to etching. In one embodiment, the ratio of halogen to carbon in the coating is controlled by further introducing a scavenger gas to the reaction chamber. In one embodiment, the scavenger gas is chosen to react with the halogen to form a byproduct gas that is removed from the reaction chamber by the vacuum system. In this way, the amount of halogen is reduced in the coating.

In one embodiment, the scavenger gas includes hydrogen gas ($H_2$). In a carbon-fluorine gas example, hydrogen forms HF gas, and thus reduces the amount of fluorine available in the chamber to form in the coating. In one embodiment, a scavenger gas is introduced to remove other species. For example, if it is desirable to have a high ratio of halogen to carbon in a coating, a scavenger gas such as $O_2$ can be introduced to preferentially remove carbon from the system, forming $CO_x$ gasses.

In one embodiment, a noble gas is further introduced to the system. Examples of noble gasses includes helium, neon, argon, krypton, xenon, and radon. In one embodiment, the addition of a noble gas further enhances the dissociation of the gas species 220 from FIG. 2 in addition to the dissociation provided by the electron beam 230. One mechanism of enhanced dissociation from noble gasses includes electron attachment dissociation.

Figure 3:
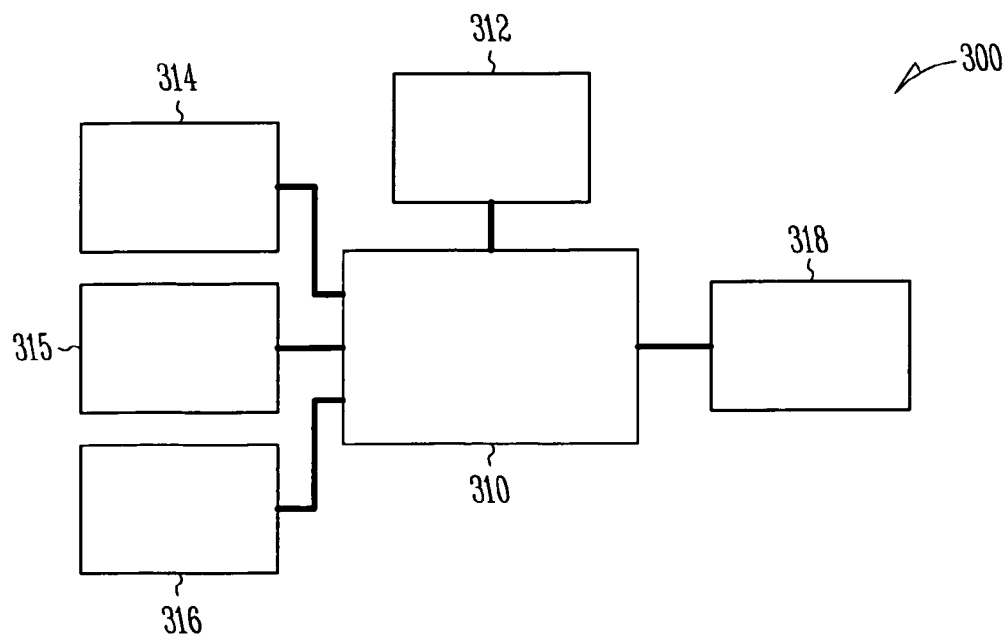
FIG. 3 shows a block diagram of a semiconductor processing system according to an embodiment of the invention.

FIG. 3 shows a block diagram of a semiconductor processing system 300. The system 300 includes a reaction chamber 310 with an electron beam source 312 coupled to the chamber 310. In one embodiment, the electron beam source 312 includes a focused scanning electron beam source such as provided in and SEM. A vacuum pump 318 is shown coupled to the reaction chamber 310. One of ordinary skill in the art having the benefit of the present disclosure will recognize that a number of possible vacuum pumps such as mechanical pumps, turbo pumps, etc. are within the scope of the invention.

A gas supply 316 is shown coupled to the reaction chamber 310. In one embodiment, the gas supply 316 provides one or more gas species in selected amounts. One gas includes a gas species to dissociate into etching and coating species. In selected embodiments, the gas supply also provides additional gasses such as scavenger gasses and/or noble gasses as discussed in embodiments above. In one embodiment, the gas supply includes controlling mechanisms and circuitry to function as an atomic layer deposition (ALD) system. For example, selected gasses can be supplied in pulses, and purge gasses or evacuation steps can be included between gas pulses. One of ordinary skill in the art having the benefit of the present disclosure will recognize that ALD gas choice depends on the chemistry of the surface where layer deposition is desired.

In one embodiment, a plasma source 315 such as a remote plasma source is coupled to the reaction chamber 310. In one embodiment, the remote plasma source 315 provides a chemical species as discussed above to dissociate into etching and coating species.

In one embodiment, a detector 314 is further included in the system 300, such as a secondary electron detector. In one embodiment, the detector 314 is used to provide imaging capability to the system 300 such as in a scanning electron microscope configuration. In one embodiment, other detection capability is also included in detector 314 such as detection of elemental composition.

Figure 4:
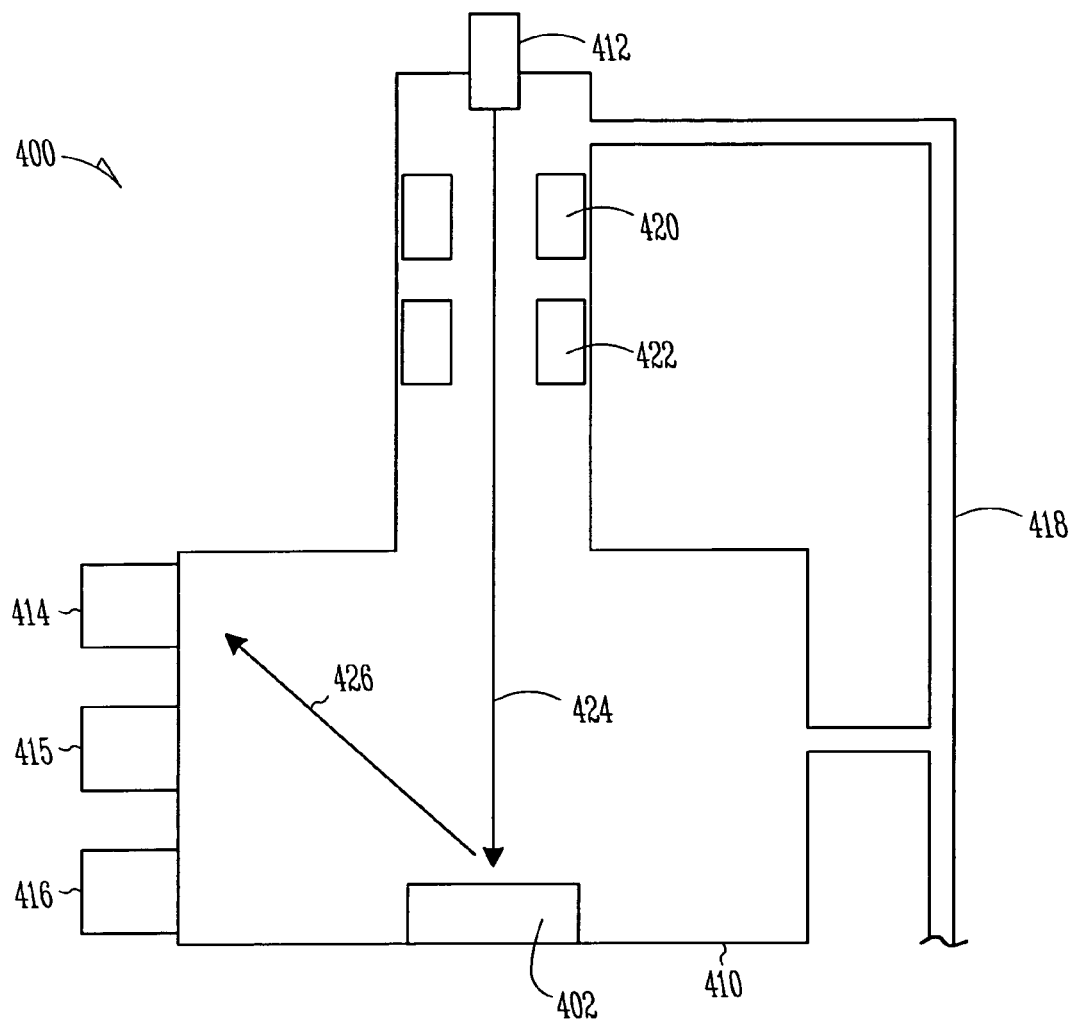
FIG. 4 shows another diagram of a semiconductor processing system according to an embodiment of the invention.

FIG. 4 shows a more detailed diagram of a system 400 similar to the system 300 shown in FIG. 3. The example system 400 in FIG. 4 includes a scanning electron type system 400 according to an embodiment of the invention. A processing chamber 410 is shown with a workpiece 402. As discussed above, in one embodiment, the workpiece includes a semiconductor device, chip, or other component. A conduit 418 or other connection is shown coupling the system 400 to a vacuum device (not shown). An electron source 412 is included in the system 400 to generate an electron beam 424 directed at a surface of the workpiece 402. In one embodiment, a beam focusing lens device 420 is included to focus the electron beam 424. In one embodiment, a scanning device 422 is further included to raster, or otherwise scan a surface of the workpiece 402 with the beam 424.

A detector 414 is shown coupled to the system 400. In one embodiment, the detector 414 includes a secondary electron detector as described above to detect secondary electrons 426 as shown in the Figure. In one embodiment, the detector 414 includes other detecting capability such as Fourier transform infrared (FTIR) detection systems, mass spectrometers, etc. for detecting and quantifying material composition.

A gas source 416 is shown coupled to the reaction chamber 410. As discussed in selected embodiments above, an example of a gas supplied by the gas source 416 includes a gas species to dissociate into one or more species that provide etching and coating. In one embodiment, one dissociated species both etches one region and coats another region. In selected embodiments, the gas source 416 provides gasses such as scavenger gasses and/or noble gasses as discussed in embodiments above. Specific gasses include, but are not limited to, $H_2$, $O_2$, noble gasses, and carbon and halogen gasses such as $CHF_3$. In one embodiment, a tube or other directing structure 417 is included to better direct the gas or gasses over the workpiece 402.

A plasma source 415 such as a remote plasma source is also coupled to the reaction chamber 410 in one example. In one embodiment, the remote plasma source 415 provides a chemical species as discussed to dissociate into one or more species that provide etching and coating. In one embodiment, one dissociated species both etches one region and coats another region. One advantage of systems that include both a gas source and a plasma source includes increased density of reactive species. Systems with both a plasma source and an electron beam activated species can generate reactive species from the plasma, as well as through interactions with the electron beam.

Further, in selected chemical systems, reactive species may be unstable, and recombine before reacting with the workpiece surface 402. In one embodiment, an electron beam interaction helps maintain a density of reactive species provided by a plasma source.

Methods of processing semiconducting wafers, semiconductor devices, IC's, surface, etc. including electron beam techniques as described above may be implemented into a wide variety of electronic devices. Embodiments of these devices may include semiconductor memory, telecommunication systems, wireless systems, and computers. Further, embodiments of electronic devices may be realized as integrated circuits.

Figure 5:
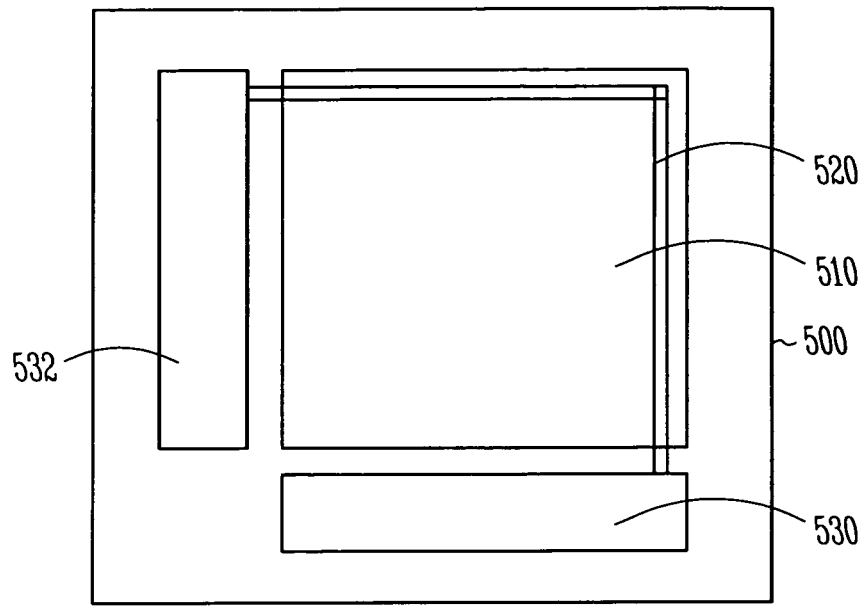
FIG. 5 shows a block diagram of a semiconductor memory according to an embodiment of the invention.

FIG. 5 illustrates an example of a semiconductor memory 500 formed using methods and devices described above. The memory 500 includes an array of memory cells 510 such as dynamic random access memory (DRAM) cells, or flash memory cells. A first sense amplifier 530 is included in one embodiment. A second sense amplifier 532 is included in one embodiment. Circuitry 520 is coupled between cells in the array 510 and one or more sense amplifiers to detect the state of selected cells.

Figure 6:
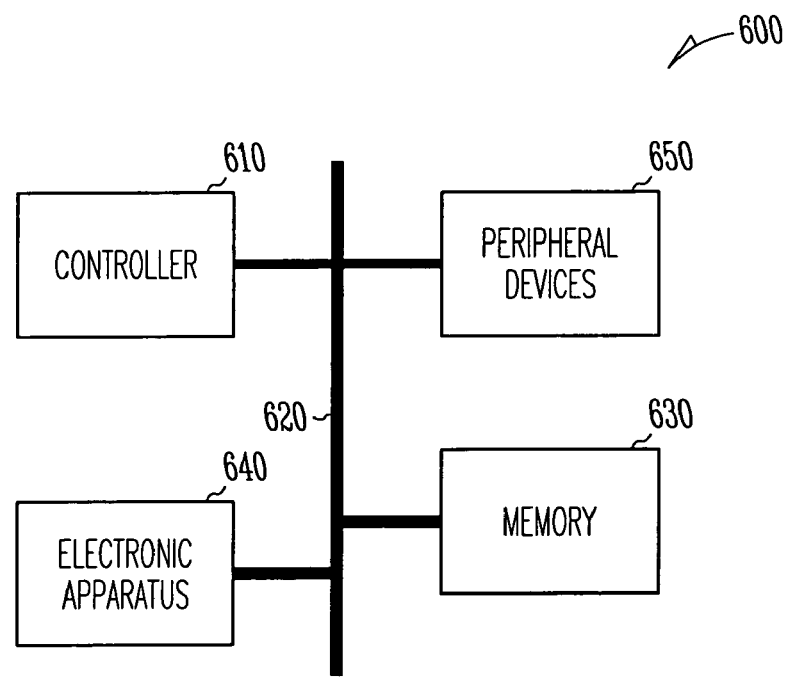
FIG. 6 shows a block diagram of an electronic system according to an embodiment of the invention.

FIG. 6 depicts a diagram of an embodiment of a system 600 having a controller 610 and a memory 630. The controller 610 or memory 630 may include structures formed by processes in accordance with the teachings herein. System 600 also includes an electronic apparatus 640 and a bus 620, where bus 620 provides electrical conductivity between controller 610 and electronic apparatus 640, and between controller 610 and memory 630. Bus 620 may include an address, a data bus, and a control bus, each independently configured. Alternatively, bus 620 may use common conductive lines for providing address, data, or control, the use of which is regulated by controller 610. In one embodiment, electronic apparatus 640 may be additional memory configured similar as memory 630. An embodiment may include an additional peripheral device or devices 650 coupled to bus 620. In one embodiment, the controller 610 is a processor. In one embodiment, the controller 610 is a processor having a memory. Any of controller 610, memory 630, bus 620, electronic apparatus 640, and peripheral device devices 650 may include structures formed by processes as described in selected embodiments above. System 600 may include, but is not limited to, information handling devices, telecommunication systems, and computers.

Peripheral devices 650 may include displays, additional storage memory, or other control devices that may operate in conjunction with controller 610. Alternatively, peripheral devices 650 may include displays, additional storage memory, or other control devices that may operate in conjunction with the controller 610 or memory 630, etc.

Memory 630 may be realized as a memory device containing structures formed by processes in accordance with various embodiments. It will be understood that embodiments are equally applicable to any size and type of memory circuit and are not intended to be limited to a particular type of memory device.

Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method of semiconductor processing, comprising:
   introducing a plasma to a semiconductor surface within a processing chamber;
   exposing the semiconductor surface to an electron beam;
   utilizing a focused energetic beam to dissociate chemical species from the plasma to form an etching species to react with a first region of the semiconductor surface; and
   concurrently depositing a coating on a second region of the semiconductor surface.

2. The method of claim 1, wherein the energetic beam is an electron beam.

3. The method of claim 2, wherein utilizing electron beam energy to dissociate chemical species includes utilizing electron beam energy to dissociate chemical species from the plasma to form an etching species to react with a silicon oxide region.

4. The method of claim 2, wherein concurrently depositing the coating on the second region of the semiconductor surface includes concurrently depositing the coating on a silicon region.

5. The method of claim 2, wherein concurrently depositing the coating includes concurrently depositing a carbon containing coating.

6. The method of claim 2, wherein introducing the plasma to a semiconductor surface includes introducing a carbon and halogen containing plasma to a semiconductor surface.

7. The method of claim 6, wherein introducing the carbon and halogen containing plasma to the semiconductor surface includes introducing a carbon and fluorine containing plasma to a semiconductor surface.

8. A method of semiconductor processing, comprising:
   introducing a number of chemical species to a semiconductor surface within a processing chamber, wherein the chemical species includes;
   at least a portion of the chemical species in a plasma state;

at least one non-ionized gas species;
exposing the semiconductor surface to an electron beam;
utilizing focused electron beam energy to dissociate one or more of the number of chemical species to form an etching species to react with a first region of the semiconductor surface; and
concurrently depositing a coating on a second region of the semiconductor surface.

9. The method of claim 8, wherein at least one non-ionized gas species includes $CHF_3$ gas.

10. The method of claim 9, wherein at least one non-ionized gas species includes a noble gas.

11. The method of claim 8, wherein the plasma includes carbon and a halogen.

12. The method of claim 11, wherein the halogen includes fluorine.

13. The method of claim 8, wherein concurrently depositing the coating includes concurrently depositing a carbon and halogen containing coating.

14. A method of semiconductor processing, comprising:
introducing a carbon and halogen containing plasma to a semiconductor surface within a processing chamber;
exposing the carbon and halogen containing plasma and the semiconductor surface to a focused electron beam;
utilizing electron beam energy to dissociate chemical species from the plasma to form an etching species to etch a silicon oxide region of the semiconductor surface; and
concurrently depositing a carbon containing coating on a silicon region of the semiconductor surface.

15. The method of claim 14, further including adding a noble gas to the processing chamber.

16. The method of claim 14, further including adding a scavenger gas to the processing chamber to remove selected species from the processing chamber.

17. The method of claim 16, wherein adding a scavenger gas includes adding $O_2$ gas.

18. The method of claim 16, wherein adding a scavenger gas includes adding $H_2$ gas to reduce the amount of halogen in the processing chamber.

19. A method of semiconductor processing, comprising:
introducing a plasma to a semiconductor surface within a processing chamber;
exposing the semiconductor surface to an electron beam;
utilizing focused electron beam energy to dissociate chemical species from the plasma to form an etching species to react with a first region of the semiconductor surface;
concurrently depositing a coating on a second region of the semiconductor surface; and
imaging the surface using the electron beam as a scanning electron microscope.

20. The method of claim 19, wherein utilizing electron beam energy to dissociate chemical species from the plasma to form the etching species includes utilizing electron beam energy to dissociate chemical species from the plasma to form a halogen containing species.

21. The method of claim 20, wherein utilizing electron beam energy to dissociate chemical species from the plasma to form the halogen containing species includes utilizing electron beam energy to dissociate chemical species from the plasma to form a fluorine containing species.

22. The method of claim 19, wherein concurrently depositing the coating includes concurrently depositing a carbon containing coating.

23. The method of claim 19, wherein introducing the plasma to the semiconductor surface includes introducing a carbon and halogen containing plasma to a semiconductor surface.

24. The method of claim 19, further including introducing a selected amount of $H_2$ gas to control a ratio of carbon to fluorine in the coating.

25. The method of claim 19, further including introducing a selected amount of $O_2$ gas to control a ratio of carbon to fluorine in the coating.

26. A method of forming a semiconductor memory device, comprising:
processing a semiconductor surface to form a number of electronic structures including:
forming a number of memory cells on a semiconductor surface;
forming circuitry to couple the number of memory cells together;
wherein processing a semiconductor surface includes:
introducing a plasma to a semiconductor surface within a processing chamber;
exposing the semiconductor surface to an electron beam;
utilizing focused electron beam energy to dissociate chemical species from the plasma to form an etching species to react with a first region of the semiconductor surface; and
concurrently depositing a coating on a second region of the semiconductor surface.

27. The method of claim 26, wherein utilizing electron beam energy to dissociate chemical species from the plasma to form the etching species to react with the first region includes utilizing electron beam energy to dissociate chemical species from the plasma to form an etching species to etch a silicon oxide isolation region.

28. The method of claim 26, further including concurrently imaging the surface using the electron beam as a scanning electron microscope.

29. The method of claim 26, wherein forming a number of memory cells includes forming a number of flash memory cells.

30. A method of forming an electronic system, comprising:
processing a semiconductor surface to form a semiconductor memory having a number of electronic structures including:
forming a number of memory cells on the semiconductor surface;
forming circuitry to couple the number of memory cells together;
wherein processing the semiconductor surface includes:
introducing a plasma to a semiconductor surface within a processing chamber;
exposing the semiconductor surface to an electron beam;
utilizing focused electron beam energy to dissociate chemical species from the plasma to form an etching species to react with a first region of the semiconductor surface;
concurrently depositing a coating on a second region of the semiconductor surface; and
coupling a controller to the semiconductor memory.

31. The method of claim 30, wherein coupling a controller to the semiconductor memory includes coupling a personal computer processor to the semiconductor memory.

32. The method of claim 30, wherein forming the number of memory cells on the semiconductor surface includes forming a number of dynamic random access memory cells on the semiconductor surface.

33. The method of claim 30, wherein introducing the plasma to the semiconductor surface includes introducing a carbon and halogen containing plasma to a semiconductor surface.

34. The method of claim 33, further including introducing a selected amount of scavenger gas to remove halogen species and control a ratio of carbon to halogen in the coating.

35. The method of claim 34, further including concurrently imaging the surface using the electron beam as a scanning electron microscope.

* * * * *